US008268735B2

(12) United States Patent
Ohmi et al.

(10) Patent No.: US 8,268,735 B2
(45) Date of Patent: Sep. 18, 2012

(54) SEMICONDUCTOR DEVICE MANUFACTURING METHOD AND METHOD FOR REDUCING MICROROUGHNESS OF SEMICONDUCTOR SURFACE

(75) Inventors: Tadahiro Ohmi, Miyagi (JP); Hitoshi Morinaga, Miyagi (JP)

(73) Assignees: Tohoku University, Sendai-Shi (JP); Foundation for Advancement of International Science, Tsukuba-Shi (JP)

( * ) Notice: Subject to any disclaimer, the term of this patent is extended or adjusted under 35 U.S.C. 154(b) by 147 days.

(21) Appl. No.: 12/223,385

(22) PCT Filed: Jan. 30, 2007

(86) PCT No.: PCT/JP2007/051487
§ 371 (c)(1),
(2), (4) Date: Jul. 30, 2008

(87) PCT Pub. No.: WO2007/088848
PCT Pub. Date: Aug. 9, 2007

(65) Prior Publication Data
US 2009/0023231 A1   Jan. 22, 2009

(30) Foreign Application Priority Data

Feb. 1, 2006 (JP) .................................. 2006-024755

(51) Int. Cl.
*H01L 21/02* (2006.01)
(52) U.S. Cl. ....................................... 438/974; 438/906
(58) Field of Classification Search .................. 438/906, 438/974
See application file for complete search history.

(56) References Cited

U.S. PATENT DOCUMENTS

| 5,842,075 | A | * | 11/1998 | Park et al. ...................... 396/611 |
| 6,153,043 | A | * | 11/2000 | Edelstein et al. ........ 156/345.12 |
| 6,251,787 | B1 | | 6/2001 | Edelstein et al. |
| 2003/0089823 | A1 | * | 5/2003 | Auner .......................... 244/75 R |
| 2004/0060582 | A1 | | 4/2004 | Sasaki et al. |
| 2004/0108575 | A1 | * | 6/2004 | Ohmi et al. .................... 257/627 |
| 2004/0129978 | A1 | * | 7/2004 | Hirai ............................. 257/347 |
| 2004/0262265 | A1 | * | 12/2004 | Funabashi et al. .............. 216/83 |
| 2005/0006348 | A1 | | 1/2005 | Miya et al. |
| 2006/0073673 | A1 | * | 4/2006 | Verhaverbeke ............... 438/455 |
| 2007/0134891 | A1 | * | 6/2007 | Adetutu et al. ............... 438/464 |
| 2009/0163597 | A1 | * | 6/2009 | Goto et al. .................... 514/626 |

FOREIGN PATENT DOCUMENTS

| DE | 40 31 676 A1 | 4/1992 |
| EP | 0 377 322 A | 7/1990 |
| GB | 1 020 328 A | 2/1966 |

(Continued)

OTHER PUBLICATIONS

Yamamoto et al., "Suppression of Surface Micro-Roughness of Silicon Wafer by Addition of Alcohol into Ultra Pure Water for Rinsing Process", Meet. Abstr.—Electrochem. Soc. 502, 757 (2006).*

(Continued)

*Primary Examiner* — N Drew Richards
*Assistant Examiner* — Peter Bradford
(74) *Attorney, Agent, or Firm* — Foley & Lardner LLP

(57) ABSTRACT

Surface treatment is performed with a liquid, while shielding a semiconductor surface from light. When the method is employed for surface treatment in wet processes such as cleaning, etching and development of the semiconductor surface, increase of surface microroughness can be reduced. Thus, electrical characteristics and yield of the semiconductor device are improved.

3 Claims, 7 Drawing Sheets

FOREIGN PATENT DOCUMENTS

| | | | |
|---|---|---|---|
| GB | 1020328 | * | 2/1966 |
| JP | 11274114 | | 10/1999 |
| JP | 2002-083796 | | 3/2002 |
| JP | 2003-234341 | | 8/2003 |
| JP | 2004-119714 | | 4/2004 |
| JP | 2005-045206 | | 2/2005 |
| JP | 2005-093562 | | 4/2005 |
| JP | 2004-296997 A | | 3/2012 |

OTHER PUBLICATIONS

Morinaga et at., "Impact of Light on the Surface Nanostructure of Silicon", Journal of the Electrochemical Society, 153 vol. 7, pp. G626-G631 (2006).*

Morita et al., "growth of native oxide on a silicon surface", J. Appl. Phys., vol. 68, p. 1272 (1990).*

M. Miyashita, T. Tusga, K. Makihara, and T. Ohmi, Dependence of Surface Microroughness of CZ, FZ, and EPI Wafers on Wet Chemical Processing. J. Electrochem. Soc., vol. 139, No. 8, Aug. 1992.*

Satoru Watanabe, Yoshihiro Sugita, The role of dissolved oxygen in hot water during dissolving oxides and terminating silicon surfaces with hydrogen. Surface Science 327 (1995) 1-8.*

Morita, M. T., et al.; "Growth of native oxide on a silicon surface"; J. Appl. Phys. 68(3), pp. 12721281; Aug. 1, 1990.

Office Action issued for JP Application No. 2007-556865 issued Mar. 21, 2012 with partial English translation (3 pgs.).

* cited by examiner 1. cleaning of substrate 2. pattern formation 3. field oxidation 4. etching 5. pre-oxidation 6. etching 7. gate oxidation Example 4
Ra:0.50nm Comparative
Example 6
Ra:2.76nm Example 5
Ra:0.64nm Example 6
Ra:0.16nm Example 18
Ra:0.13nm Comparative
Example 18
Ra:4.10nm

SEMICONDUCTOR DEVICE MANUFACTURING METHOD AND METHOD FOR REDUCING MICROROUGHNESS OF SEMICONDUCTOR SURFACE

This application is the National Phase of PCT/JP2007/051487, filed Jan. 30, 2007, which claims priority to Japanese Application No. 2006-024755, filed Feb. 1, 2006, the disclosures of which are hereby incorporated by reference in their entirety.

TECHNICAL FIELD

The present invention relates to a technology for manufacturing a semiconductor substrate and a semiconductor device. In particular, the present invention relates to a surface treatment method capable of suppressing occurrence of microroughness of a semiconductor surface to form a flat semiconductor surface, a semiconductor device manufacturing method including the surface treatment method, and an apparatus for performing the methods.

BACKGROUND ART

High integration and high performance of a semiconductor device as typified by a flat panel display using LSIs and a TFT-LCD have been endlessly requested. It is pointed out that surface roughness or an unnecessary semiconductor oxide on a semiconductor surface, an insulating film/semiconductor interface, or an electrode/semiconductor interface brings about deterioration of electrical characteristics of the semiconductor device or a reduction in yield thereof.

A problem with respect to the surface roughness of a gate insulating film/semiconductor interface does not explicitly appear in the case of manufacturing a relatively large-sized device. However, the problem cannot be neglected as a device size has been reduced in recent years and the gate insulating film becomes thinner and thinner. This applies to the unnecessary semiconductor oxide also. The above-mentioned problem becomes more serious with the advent of a next generation device such that a high-dielectric constant material except a silicon oxide film is used for the gate insulating film.

It has been known that the semiconductor surface is oxidized when it is exposed to water and oxygen. According to Non-Patent Document 1, the following has been reported by Morita et al. The oxidation process of silicon is analyzed in an atmosphere. The result of the analysis teaches that oxidation occurs at room temperature after several hours in a usual air atmosphere containing moisture. In contrast to this, oxidation does not occur in a dry air atmosphere containing no moisture even after a lapse of 150 hours or more.

This means that oxidation takes place during a wet process such as cleaning, etching, or chemical mechanical polishing (CMP) each of which uses an aqueous solution Herein, it is noted that oxidation occurring in an aqueous solution is also strongly affected by dissolved oxygen in the liquid. Non-Patent Document 1 describes that the oxidation of silicon in ultra-pure water is strongly affected by dissolved oxygen in the ultra-pure water and that the growth of an oxide film becomes difficult when the concentration of dissolved oxygen is reduced.

In order to suppress the oxidation of silicon during the wet process, use has been made of pure water which has a reduced concentration of dissolved oxygen or which has nitrogen or hydrogen added and dissolved after removal of oxygen.

However, even when the above-mentioned technologies are used, an inevitable problem takes place such that oxygen from the air atmosphere is dissolved in a liquid and oxidation is caused to occur because the wet process such as cleaning, etching, or CMP is carried out in the air atmosphere. In addition, there is another problem that the oxidation of silicon subtly occurs even in hydrogenated water free from oxygen.

With respect to the surface roughness, it has been known that the dissolution of silicon occurs even in pure water with reduced dissolved oxygen and surface flatness deteriorates with the progress of the dissolution. The dissolution rate of silicon increases as pH becomes higher. In the case of a liquid whose pH is equal to or larger than 3, particularly, an alkali solution, roughness occurs and significantly deteriorates the surface flatness.

Many solutions from a neutral range to alkali range, including pure water used to rinse a chemical solution, are often employed in the wet process such as cleaning, etching, or polishing on the semiconductor surface, so the increase in roughness becomes a problem. A cause of the increase in roughness in addition to a cause of the dissolution of silicon are not yet fully determined.

In the case of silicon, it is more likely to cause roughness on a 110 plane or a 551 plane to deteriorate surface flatness as compared with a 100 plane which is a plane orientation used for a conventional semiconductor device. Although the 110 plane is more excellent in electrical device characteristic than the 100 plane, the above-mentioned manufacturing technical problem thereof hinders practical use.

In order to suppress the surface roughness in the wet process described above, there is a method of lowering a pH of an aqueous solution, a method of shortening a treatment time, a method of reducing a temperature, or the like. However, such methods should degrade cleaning performance or etching performance to some extent. Therefore, the elucidation of a roughness increase mechanism and radical improved technologies based thereon have been awaited.

Non-Patent Document 1: J. Appl. Phys., Vol, 68, No. 3: pp. 1272-1281, 1990

Patent Document 1: Japanese Patent (JP-B) No. 3083809

DISCLOSURE OF THE INVENTION

Problems to be Solved by the Invention

An object of the present invention is to provide a treatment method and a treatment apparatus which are capable of reducing an increase in surface microroughness of a semiconductor surface during a surface treatment process in which a surface of a semiconductor material is exposed to a liquid.

Another object of the present invention is to provide a treatment method and a treatment apparatus which are capable of reducing unintended oxidation of a semiconductor surface during a surface treatment process in which a surface of a semiconductor material is exposed to a liquid.

Means to Solve the Problems

The inventors of the present invention conducted concentrated studies in order to solve the above-mentioned problems. As a result, it was surprisingly found that, although light from a fluorescent lamp or the like is naturally present in surface treatment environments, such light adversely affects semiconductor surface roughness and surface oxidation. Based on such a finding, the present invention has completed.

In other words, a main point of the present invention resides in a semiconductor device manufacturing method wherein, in a surface treatment process in which the surface of a semiconductor material is exposed to the liquid, the surface of the semiconductor material is shielded from light, a method for reducing surface microroughness of the semiconductor surface, and an apparatus therefor. To be specific, the semiconductor device manufacturing method is featured by performing the above-mentioned surface treatment process in a treatment chamber shielded from light so that the surface of the semiconductor material is not exposed to light.

Patent Document 1 proposes a method of preventing the electrochemical dissolution of a metal conductor which is induced by exposing a semiconductor device to light. When a PN junction formed in a semiconductor circuit is irradiated with light having energy equal to or larger than a band gap energy of a semiconductor, a phenomenon is caused to occur such that a current flows through the PN junction portion. This phenomenon is similar to that appearing in the case of a solar cell. At this time, when each of P and N is connected with two metal conductors exposed to an electrolytic solution, an anode metal component dissolves because all of the elements required for electrolysis are present. Therefore, it is proposed to prevent the semiconductor material from being exposed to the light described above.

Patent Document 1 can be very logically understood in view of the solar cell and the electrochemical dissolution. That is, Patent Document 1 describes that the electrochemical dissolution occurs in the case where the PN junction portion is irradiated with light. However, Patent Document 1 does not suggest at all a problem with respect to the increase in roughness of the semiconductor surface, a problem with respect to surface oxidation, and the like.

In contrast to this, the inventors of the present invention experimentally discovered for the first time the new fact that the roughness of the semiconductor surface is increased by light irradiation even in the case where the circuit including neither the PN junction nor the metal conductors is formed on a semiconductor substrate (Simple P-type semiconductor substrate surface or N-type semiconductor substrate surface only). In particular, it was determined that the roughness of the semiconductor surface is increased by light irradiation in the case where the semiconductor surface is subjected to surface treatment using water or an aqueous solution. The reason of the increase in roughness may be that an oxide is locally formed on the semiconductor surface by light to increase the surface roughness because of a dissolution rate difference between a semiconductor and a semiconductor oxide. However, other reasons may exist.

Hereinafter, aspects of the present invention will be specifically described.

In the present invention, a semiconductor material may be a semiconductor substance and may not be limited to a kind of the semiconductor material. For example, the semiconductor material may be of a single element such as silicon or germanium and of a compound semiconductor such as gallium arsenide, gallium nitride, or silicon germanium. The present invention can be applied to not only a single crystalline semiconductor material but also a polycrystalline semiconductor material and an amorphous semiconductor material.

Silicon is particularly preferably used for a semiconductor integrated circuit. Single crystalline silicon is normally used as the silicon for the semiconductor integrated circuit. Examples of a crystal plane orientation of the silicon surface include a (100) plane, a plane obtained by offcutting the (100) plane by 4°, a (110) plane, a (551) plane, and a (111) plane. The (110) plane and the (551) plane are more likely to cause surface roughness during the conventional wet process. However, when the present invention is employed, the surface roughness can be significantly suppressed, so the planes can be preferably used.

Amorphous silicon or polycrystalline silicon is used for a TFT for display or the like and a solar cell, and the present invention can also be used therefor.

Examples of the surface treatment process in which the surface is exposed to the liquid in the present invention include wet process steps such as cleaning, etching, development, and polishing. Note that each of the steps includes a chemical solution treatment step, an ultra-pure water rinsing step of removing a chemical solution, and a dry step.

In a semiconductor device manufacturing process, cleaning is frequently performed in order to remove a contaminant or an unnecessary oxide on a substrate surface. Among the cleanings, the present invention is applied to a cleaning step in which the semiconductor surface is exposed, for example, cleaning during a silicon wafer manufacturing process, cleaning before the formation of a gate insulating film, or cleaning before the formation of a contact between silicon and a metal wiring. In particular, reductions of the unnecessary oxide and the surface microroughness are strongly required for the cleaning before the formation of the gate insulating film, so it is preferable to apply the present invention.

In order to clean the semiconductor surface, chemical solutions and pure water having various pH ranges, such as a sulfuric acid/hydrogen peroxide mixture (SPM), a hydrochloric acid/hydrogen peroxide mixture (HPM), an ammonia/hydrogen peroxide mixture (APM), a hydrofluoric acid, a hydrofluoric acid/hydrogen peroxide mixture (FPM), ammonia water, an NaOH aqueous solution, a KOH aqueous solution, a tetramethylammonium hydroxide (TMAH) aqueous solution, a choline aqueous solution, and ultra-pure water, are used and can be applied to the present invention. In particular, a liquid whose pH is equal to or larger than 3 causes significant deterioration of surface microroughness, and the present invention can be preferably applied to such a liquid because the roughness is reduced.

Further, in a dilute hydrofluoric acid treatment step of removing an oxide film from a silicon surface or in a subsequent pure water rinsing step, it is necessary to completely suppress the production of the oxide. Therefore, it is preferable to employ the present invention.

When the present invention is employed for an etching step, it is possible to use an acid solution, an alkali solution, and a mixture thereof, which are known as etching solutions up to now. To be specific, there are hydrofluoric acid aqueous solutions such as a hydrofluoric acid, a buffered hydrofluoric acid, a hydrofluoric acid/nitric acid mixture, a hydrofluoric acid/nitric acid/acetic acid mixture, a hydrofluoric acid/nitric acid/phosphoric acid mixture, and a hydrofluoric acid/hydrogen peroxide mixture (FPM), alkaline aqueous solutions such as ammonia water, an ammonia/hydrogen peroxide mixture (APM), an NaOH aqueous solution, a KOH aqueous solution, a tetramethylammonium hydroxide (TMAH) aqueous solution, a choline aqueous solution, and an ethylenediamine aqueous solution, a phosphoric acid/nitric acid/acetic acid, an oxalic acid, a cerium ammonium nitrate aqueous solution, and the like. Of them, the hydrofluoric acid aqueous solutions and the alkali aqueous solutions are used in many cases with the semiconductor surface being directly exposed to the liquid, so the present invention is preferably employed. During an alkali etching step for silicon substrate which is used to manufacture a silicon wafer, in particular, surface roughness is significant and thus becomes a problem. Therefore, the present invention is preferably employed.

When the present invention is employed for a development step, a TMAH aqueous solution, a choline aqueous solution, an NaOH aqueous solution, and a KOH aqueous solution, which are known as developing solutions up to now, are used. Those alkaline aqueous solutions are likely to dissolve particularly the surface of a semiconductor such as silicon, thereby also increasing the surface microroughness. Therefore, it is preferable to apply the present invention.

The present invention can be also employed for a polishing step such as chemical mechanical polishing (CMP). In particular, an example of the polishing step in which the semiconductor surface is exposed to the liquid includes a final polishing step performed to manufacture a semiconductor substrate. A silica slurry, a ceria slurry, and an alumina slurry, which are known up to now, can be used as polishing agents. In particular, a colloidal silica-based slurry is preferable because the surface microroughness can be reduced.

In order to prevent the dissolution of the semiconductor surface and to reduce the roughness thereon, an organic solvent, a surface active agent, or the like may be added to ultra-pure water and various chemical solutions which are used for surface treatment. The present invention is preferable because the surface microroughness can be further reduced in combination with those technologies. Examples of the organic solvent include alcohols such as 2-propanol and ethanol, ketones such as ethyl methyl ketone and diethyl ketone, and surface active agents such as polyoxyethylene alkyl ether and alkylbenzene sulfonic acid.

Ultra-pure water and various chemical solutions which are used for surface treatment may be degassed with atmospheric components or dissolved with a dissolving gas such as hydrogen, nitrogen, ozone, ammonia, or carbon dioxide, if necessary.

The present invention can be applied even in the case where the chemical solution or the pure water contains dissolved oxygen. However, when the dissolved oxygen reduces, the oxidation and the surface roughness can be further reduced. The concentration of oxygen contained in the liquid is equal to or lower than 1 ppm, preferably equal to or lower than 10 ppb.

Further, in order to suppress redissolution of oxygen, it is preferable to dissolve hydrogen or nitrogen in the liquid.

It is preferable to replace an atmosphere of the surface treatment process by nitrogen to reduce a concentration of oxygen in a vapor phase in addition to the reduction in concentration of oxygen contained in the liquid because the redissolution of oxygen in the liquid can be suppressed.

The feature of the present invention is to prevent the semiconductor surface from being irradiated with light. A band gap energy of a semiconductor such as silicon is 1.1 eV. Light having an energy equal to or larger than the band gap energy is a light beam whose wavelength is equal to or smaller than 1.1 μm and includes a part of an infrared beam, a visible light beam, an ultraviolet beam, and the like. Among others, the visible light beam and the ultraviolet beam from a fluorescent lamp, an LED lamp, and the like, which are present in large amounts in semiconductor device manufacturing environments, cause the increase in microroughness of the silicon surface. Therefore, it is important to block the beams. It is to be noted that a wavelength of target light is not limited to 1.1 μm or less.

The light shielding is performed as follows. In order to prevent the semiconductor surface from being exposed to light, a light source is removed from a surface treatment apparatus and a portion onto which light may be incident from the outside of the apparatus is covered with a light shielding material. In this case, in order to prevent the semiconductor surface from being irradiated with light, it is desirable to perform surface treatment using a liquid, such as cleaning, etching, or development in a dark state obtained by shielding light. Therefore, even when the treatment is performed in the dark state, it is unnecessary to visually check the state of the semiconductor surface during the surface treatment.

According to the present invention, the semiconductor surface treatment is performed in the light shielding state. When some measurement means or devices using light is used to check the presence or absence of the substrate or the position thereof or to perform in-line surface measurement, film thickness measurement, or the like, it is preferable to use light whose influence on surface roughness is relatively small and whose energy is equal to or smaller than the band gap energy of the semiconductor. To be specific, in the case of silicon, a light beam whose wavelength is equal to or larger than 1.2 μm, for example, a far-infrared beam, can be used. The measurement technologies can be preferably used for the process such as cleaning, etching, or development.

In addition, the present invention can be applied to the process in which the semiconductor surface is exposed to the liquid. When moisture is absorbed on the surface even in the case of a manufacturing process or a storage process in a vapor phase, the same phenomenon may occur. Therefore, it is preferable to further apply the present invention to these processes. It is known that moisture is absorbed on the surface of a silicon wafer in the atmosphere at room temperature. In particular, it is preferable to perform light shielding under an environment in which moisture may be absorbed on the semiconductor surface in a process after an oxide on the silicon surface is removed by etching.

When the present invention is employed, the microroughness of the semiconductor surface can be reduced. Before the formation of the gate insulating film of a semiconductor device, particularly, flatness of the atomic order is required. However, according to a conventional technology, the center line average roughness (Ra) measured by an AFM is approximately 0.1 nm to 0.15 nm. When the present invention is employed, a very flat semiconductor surface whose Ra is equal to or smaller than 0.1 nm can be realized, thereby improving the performance of the semiconductor device.

In order to reduce the surface microroughness, a proposed planarization treatment process such as high-temperature thermal oxidation, epitaxial growth, or hydrogen annealing treatment may be performed before the treatment in the present invention. This method is preferable because the surface microroughness can be further reduced.

Effect of the Invention

When the present invention is employed for a wet process on the semiconductor surface, such as cleaning, etching, development, or polishing, the increase in surface microroughness and the production of the oxide which is slightly formed up to now can be suppressed. Therefore, the electrical characteristics of the semiconductor device and the yield thereof can be improved.

BEST MODE FOR EMBODYING THE INVENTION

Hereinafter, a surface treatment method and a surface treatment apparatus according to the present invention will be described with reference to the attached drawings. The present invention is not limited by the following embodiments without departing from the spirit thereof.

Embodiment 1

In Embodiment 1, description will be made about the case where a treatment method according to the present invention is used to manufacture a semiconductor device.

The present invention can be applied to various surface treatment processes such as cleaning, etching, development, and polishing, which are used in a current semiconductor manufacturing process. The surface treatment processes are all performed in a treatment chamber. In the present invention, the surface treatment processes are performed in a state in which the treatment chamber is surrounded by a light shielding material to block light. In this case, an aluminum foil coated with a resin is used as the light shielding material and the treatment chamber is shielded from light.

Figure 1:
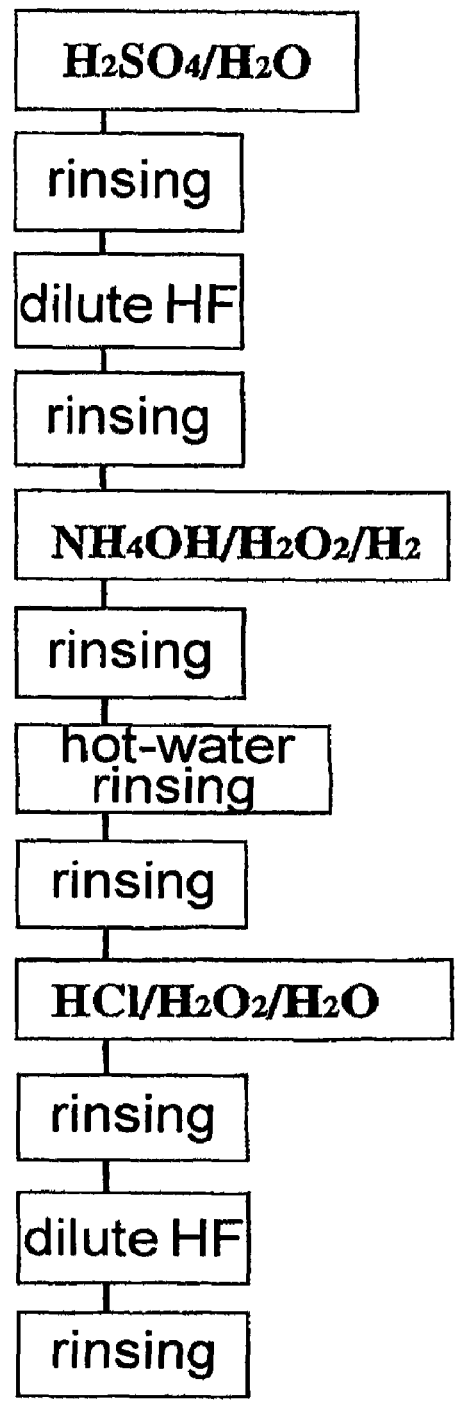
FIG. 1 is a flowchart showing an example of a cleaning process to which the present invention can be applied.

FIG. 1 shows an example of an RCA cleaning method which is widely used as an example of the cleaning process to clean the semiconductor device. So-called rinsing treatment for removing a chemical solution on a substrate surface with water is performed between respective chemical solution treatments. The present invention can be applied to the respective chemical solution treatment steps and the rinsing step. In particular, it is preferable to apply the present invention because an oxide film on a semiconductor surface is removed before dilute hydrofluoric acid cleaning or subsequent rinsing.

Hereinafter, an example will be described in which the present invention is applied to thermal oxidation treatment normally employed as an initial process for manufacturing a semiconductor device such as a dynamic random access memory (DRAM), that is, pretreatment before the formation of a so-called gate oxide film. The case where the process is applied to manufacture the DRAM will be described. However, the process is used as a process for manufacturing not only the DRAM but also a wide variety of LSIs.

Figure 2:
FIG. 2 is a view for describing, in the order of process steps, a gate oxide film forming process to which the present invention can be applied.
Figure 2:
Figure 2:
Figure 2:
Figure 2:
Figure 2:
Figure 3:
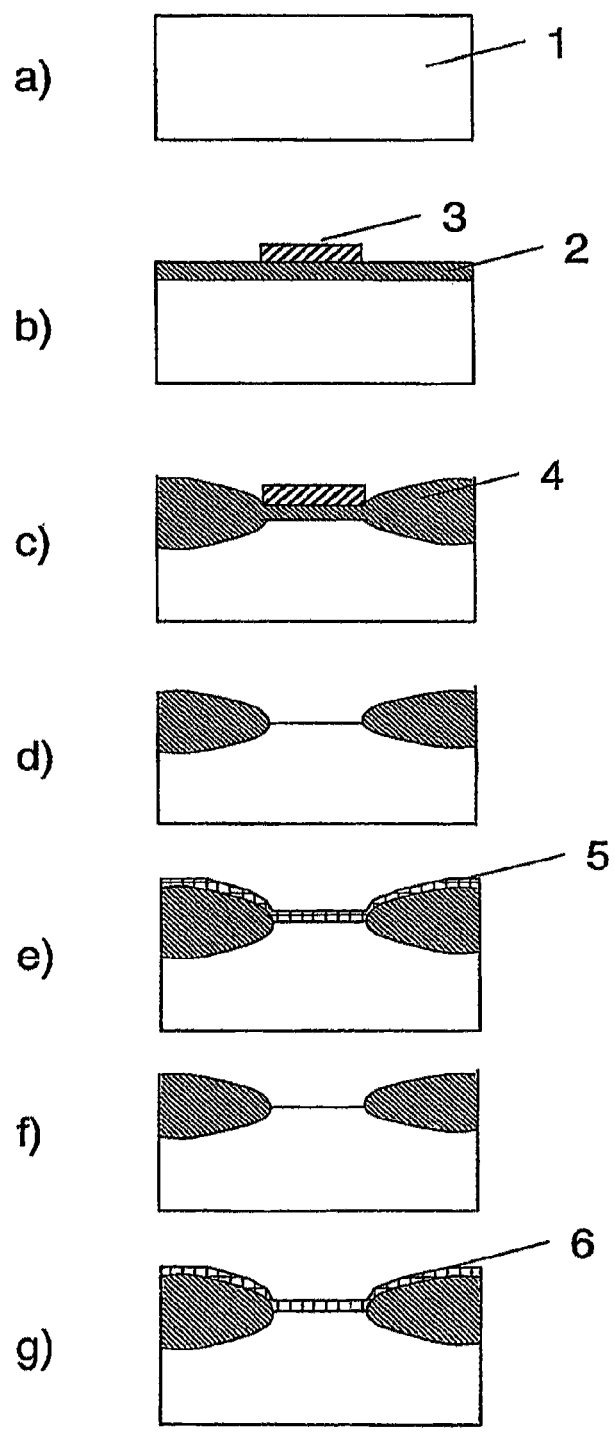
FIG. 3 shows cross sectional views a) to g) for describing the gate oxide film forming process in the order of process steps.

FIG. 2 shows an example of a gate oxide film forming process and FIG. 3 shows cross sections of a semiconductor substrate at treatment stages thereof in the gate oxide film forming process. A semiconductor substrate 1 made of a silicon single crystal as shown in a) of FIG. 3 is prepared. After the semiconductor substrate 1 is cleaned (Step: 1 in FIG. 2), a silicon oxide film 2 and a silicon nitride film 3 of b) of FIG. 3 are formed. After a pattern is formed by a photolithography technology (Step: 2 in FIG. 2), a field oxide film 4 of c) of FIG. 3 is formed (Step: 3 in FIG. 2). After that, as shown in d) of FIG. 3, the silicon nitride film 3 is etched. The field oxide film 4 is also etched using a HF chemical solution (Step: 4 in FIG. 2) to expose the surface of the silicon substrate on a gate region. Then, a pre-oxide film 5 shown in e) of FIG. 3 is formed (Step: 5 in FIG. 2). As shown in of FIG. 3, the oxide film formed by using the HF chemical solution is etched (Step: 6 in FIG. 2). Then, a gate insulating film 6 shown in FIG. 3 is formed (Step: 7 in FIG. 2).

The present invention can be used for the cleaning (1 in FIG. 2) of the semiconductor substrate, the etching (4 in FIG. 2) of the gate region oxide film due to the etching of the field oxide film, the etching (6 in FIG. 2) of the pre-oxide film, and the cleaning (chemical solution cleaning and water rinsing) process performed after each etching, which are included in the above-mentioned process.

When the present invention is used for each step before the formation of the gate insulating film, the surface roughness of an interface between the formed gate insulating film and the semiconductor substrate and the production of an unnecessary oxide thereon can be suppressed, so the performance of the manufactured semiconductor device can be improved. The improvement of flatness of an interface between the gate insulating film and the silicon substrate is greatly attributed to the improvement of the performance of the manufactured semiconductor device.

EXAMPLES

Hereinafter, specific examples of the present invention will be described. However, the present invention is not limited by the following examples without departing from the spirit thereof.

Example 1 and Comparative Example 1

An effect of the present invention to suppress oxidation of a silicon surface of a silicon wafer treated with ultra-pure water is determined. The silicon wafer (manufactured by the CZ method; n-type, resistivity of 0.8 Ωcm to 1.2 Ωcm, plane orientation of 100) is used. The silicon wafer is cleaned in advance with sulfuric acid/hydrogen peroxide water and then subjected to dilute hydrofluoric acid treatment (0.5%, room temperature, 1 minute) to remove an oxide film from the surface thereof. After that, the resultant silicon wafer is rinsed with ultra-pure water for 5 minutes.

An experiment is performed in a clean room of class 1 at a temperature of 23 degrees in the atmosphere.

Example 1 is performed in an environment in which light is blocked by a light shielding material made of aluminum (state in which a treatment chamber is surrounded by the light shielding material). Comparative Example 1 is performed during irradiation using a fluorescent lamp. The fluorescent lamp has 15 W and is located just above a treatment bath. An illuminance at the vicinity of the silicon surface is approximately 10000 lx. The silicon wafer is placed at a depth of 35 mm from a liquid surface of the treatment bath. The surface of the silicon water is faced upward such that light from the fluorescent lamp is vertically incident thereon. The treatment bath (750 cc) is filled with ultra-pure water saturated with air. The ultra-pure water saturated with air is supplied from a bottom portion of the treatment bath at a flow rate of approximately 1.5 L/minute to overflow the bath. The silicon wafer immersed under such an environment is pulled up after a lapse of a predetermined time. Then, the silicon wafer is dried with nitrogen blowing and a state of the silicon surface is measured.

A concentration of oxygen dissolved in the ultra-pure water saturated with air is approximately 8 ppm.

An oxidation state of the silicon surface is measured using an attenuated total reflection Fourier transform infrared (FTIR-ATR) method while the surface of the silicon wafer is brought into close contact with a Ge prism whose bevel portion is cut at approximately 30 degrees. According to this method, a peak of a silicon halide which is unoxidized silicon is detected in the vicinity of 2050 $cm^{-1}$ to 2150 $cm^{-1}$. A peak resulting from a silicon oxide in which oxygen atoms are inserted into the back bonds of silicon is detected in the vicinity of 2250 $cm^{-1}$.

Figure 4:
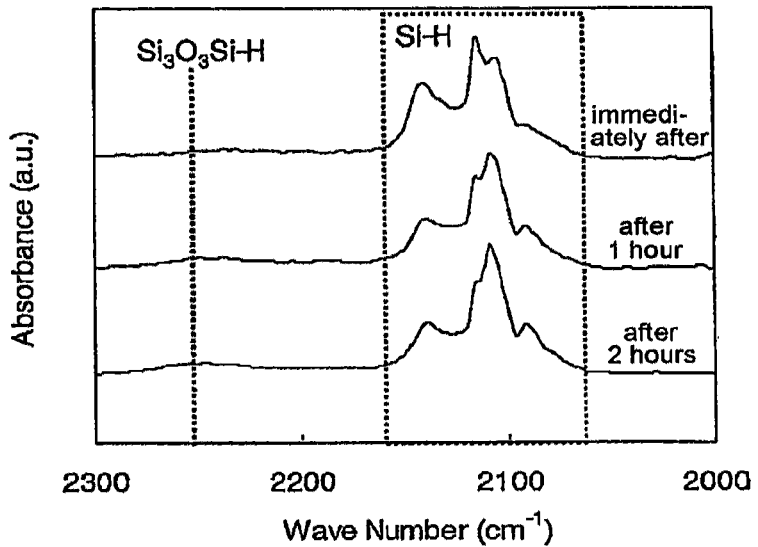
FIG. 4 shows (a) a graph for describing a measurement result in the case where surface treatment in Example 1 of the present invention is performed, and (b) a graph showing a measurement result in Comparative Example 1 in which surface treatment is performed without employing the present invention.
Figure 4:
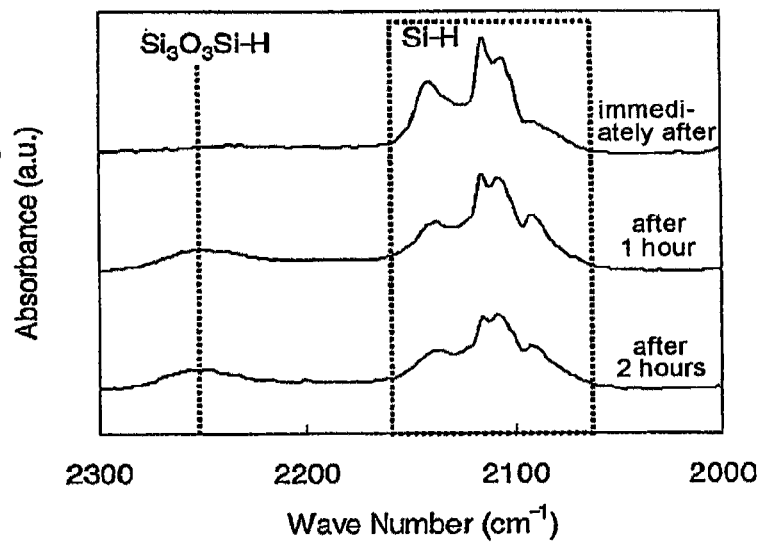

FIG. 4 shows results. When the irradiation using the fluorescent lamp is performed in Comparative Example 1, although the peak intensity of the silicon halide reduces with the lapse of time, the peak intensity resulting from the silicon oxide increases. In contrast to this, in the light shielding state of Example 1, even when the time elapses, the peak of the silicon halide is relatively held and the peak intensity resulting from the silicon oxide does not increase.

As is apparent from the results, even in the case where a normal silicon wafer is treated with only pure water heavily used for various surface treatment processes including cleaning, when light is present, oxidation is promoted, so the oxidation can be greatly suppressed by light shielding.

Example 2 and Comparative Examples 2 and 3

Figure 5:
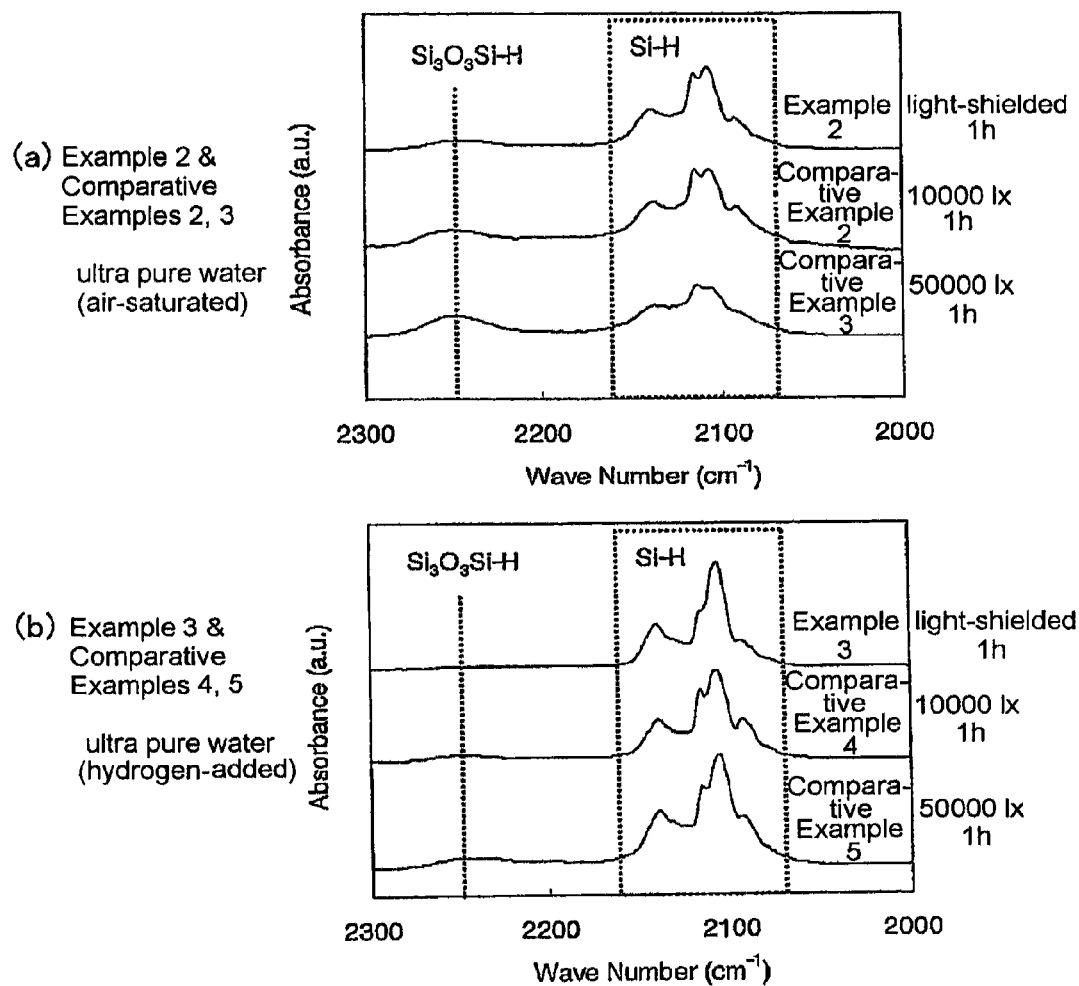
FIG. 5 shows (a) measurement results in Example 2 of the present invention and Comparative Examples 2 and 3 in the case where a silicon wafer is immersed in ultra-pure water saturated with air, and (b) measurement results in Example 3 of the present invention and Comparative Examples 4 and 5 in the case where a silicon wafer is immersed in ultra-pure water added with hydrogen.

In FIG. 5(a), surface states of a silicon wafer immersed in ultra-pure water saturated with air for 1 hour are compared with one another at different light intensities.

A fluorescent lamp is used for an illuminance of 10000 lx in Comparative Example 2. A halogen lamp is used for an illuminance of 50000 lx in Comparative Example 3. The ultra-pure water is not additionally supplied during the immersion for 1 hour. Other conditions are the same as in Example 1.

As compared with the light shielding state in Example 2, it is apparent in Comparative Examples 2 and 3 that, as the light intensity is larger, the peak intensity resulting from the oxide becomes large. This shows that the amount of oxide increases.

Example 3 and Comparative Examples 4 and 5

In FIG. 5(b), surface states of a silicon wafer immersed for 1 hour using ultra-pure water added with hydrogen of 1.3 ppm to 1.5 ppm at a dissolving oxygen concentration equal to or lower than 1 ppb are compared with one another at different light intensities.

A halogen lamp is used for illumination in Comparative Examples 4 and 5. During the immersion for 1 hour, the ultra-pure water added with hydrogen is supplied from the bottom portion of the treatment bath at a flow rate of approximately 1.5 L/minute to overflow the bath. Other conditions are the same as in Example 1.

It is apparent that, when ultra-pure water whose dissolving oxygen amount is reduced is used in the light shielding state, the production of the oxide can be further suppressed. It is also apparent in Comparative Examples 4 and 5 that, even in the case where the ultra-pure water added with hydrogen is used as described above, as the light intensity is larger, the peak intensity resulting from the oxide slightly increases. This shows that the amount of oxide increases.

Examples 4 to 14 and Comparative Examples 6 to 13

An effect of the present invention to suppress surface microroughness of a silicon wafer subjected to surface treatment with ammonia water is determined. Experimental conditions and results are shown in Table 1.

The silicon wafer is manufactured by a CZ method. The plane orientations are 100, 110, 551, and 111. An n-type (resistivity is 0.8 Ωcm to 1.2 Ωcm), a p-type (resistivity is 8 Ωcm to 12 Ωcm), an $n^+$-type (doped with phosphorus at approximately $10^{20}$ atoms/$cm^2$) are used. Before the experiments of Table 1, pretreatment is performed. The silicon wafer is cleaned in advance with sulfuric acid/hydrogen peroxide water and then subjected to dilute hydrofluoric acid treatment (0.5%, room temperature, 1 minute) to remove an oxide film from the surface thereof. After that, the resultant silicon wafer is rinsed with ultra-pure water for 5 minutes.

The experiments are performed in a clean room of class 1 at a temperature of 23 degrees in the atmosphere. In addition, only when the surface treatment condition section in the table indicates "UNDER NITROGEN ATMOSPHERE", an experiment is performed in a glove box substituted with nitrogen.

Examples 4 to 14 are performed in a light shielding environment. Comparative Examples 6 to 13 are performed during irradiation using a fluorescent lamp. A treatment bath (750 cc) is filled with ammonia water shown in Table 1. The silicon wafer is subjected to surface treatment. The fluorescent lamp has 15 W and is located just above the treatment bath. An illuminance at the vicinity of the silicon surface is approximately 10000 lx. The silicon wafer is placed at a depth of 35 mm from a liquid surface of the treatment bath. The surface of the silicon water is faced upward such that light from the fluorescent lamp is vertically incident thereon.

In the table, "ammonia water" means that a 29 wt % aqueous solution of ammonia for semiconductor industry is diluted with ultra-pure water to 0.26 wt %. The pH is approximately 11. The ultra-pure water whose oxygen concentration is equal to or lower than 1 ppb is used. In the case of experiments in the atmosphere, oxygen in the atmosphere is dissolved during the treatment, so the dissolved oxygen concentration may be equal to or higher than 1 ppm. "ammonia water (saturated with air)" means that the "ammonia water" is adjusted, and then supplied into a bottle together with air and sufficiently agitated to mix a gas and a liquid, and thus saturated with air. "Ammonia water (with hydrogen water and under nitrogen atmosphere)" means that oxygen dissolved in the 29% ammonia aqueous solution for semiconductor industry is substituted with nitrogen in the glove box whose atmosphere is substituted with nitrogen, and then the ammonia aqueous solution is diluted with ultra-pure water added with hydrogen to 0.26 wt %. A concentration of oxygen dissolved in the solution is equal to or lower than 0.1 ppm.

The silicon wafer is immersed in the ammonia water for 10 minutes and then rinsed in the light shielding state with ultra-pure water added with hydrogen (dissolving oxygen concentration is equal to or lower than 1 ppb and hydrogen concentration is 1.3 ppm to 1.5 ppm) for 5 minutes. After that, the silicon wafer is pulled up and dried with nitrogen blowing. Then, the microroughness of the silicon surface is measured.

The surface microroughness is measured using an atomic force microscope (AFM). For comparison, surface microroughness values of a silicon wafer subjected to only pretreatment are listed as initial values in the table.

Figure 6:
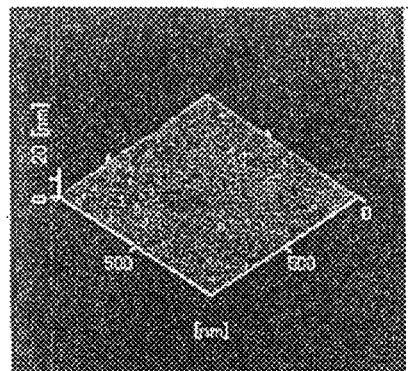
FIG. 6 is a view showing AFM images in Example 4 of the present invention, Comparative Example 6, and Examples 5 and 6 of the present invention.
Figure 6:
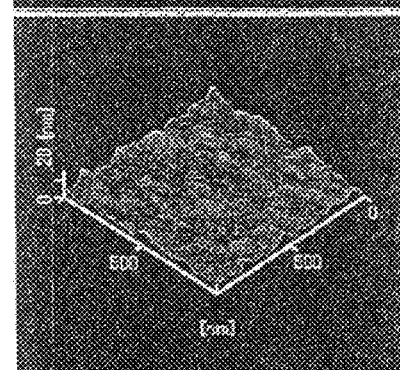
Figure 6:
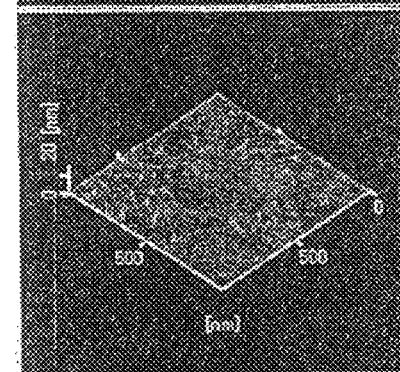
Figure 6:
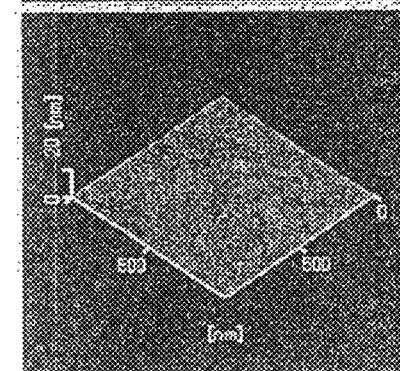

FIG. 6 shows AFM images in Examples 4, 5, and 6 and Comparative Example 6.

As is apparent from the results obtained by experiments, in the case of the light shielding state, even when the silicon surface has any one of the plane orientations or types, the increase in surface microroughness can be suppressed.

The surface microroughness in the light shielding state is further reduced by reducing the dissolving oxygen concentration to 0.1 ppm or less using the ultra-pure water added with hydrogen under the nitrogen atmosphere (Examples 6 and 12).

It is apparent that the surface microroughness can be significantly reduced by light shielding in the case of the plane orientation of, particularly, a 551 plane.

Examples 15 to 18 and Comparative Examples 14 to 20

An effect of the present invention to suppress surface microroughness of a silicon wafer subjected to surface treatment with ultra-pure water is determined. Experimental conditions and results are shown in Table 2.

Examples are performed in a light shielding environment. Comparative examples are performed during irradiation using a fluorescent lamp or an LED lamp (wavelength is 530 nm or 625 nm). An illuminance at the vicinity of the silicon surface is set to approximately 10000 lx in the case of each of the fluorescent lamp and the LED lamp. Ultra-pure water (ultra-pure water added with hydrogen) is used as a surface treatment liquid. Treatment times are set to times as shown in the table. After the surface treatment using the ultra-pure water added with hydrogen, the silicon wafer is pulled up and dried with nitrogen blowing. Then, the surface treatment is performed by the same method as in Example 4 and surface microroughness is measured.

TABLE 1

| | type of substrate | | surface treatment condition | | | surface microroughness (nm) | | |
|---|---|---|---|---|---|---|---|---|
| | plane orientation | type | bath | time | light | Ra | Rms | P – V |
| initial value | 100 | N | no | no | no | 0.14 | 0.18 | 1.66 |
| Example 4 | 100 | N | ammonia water | 10 min | shielded | 0.50 | 0.81 | 11.27 |
| Comparative Example 6 | 100 | N | ammonia water | 10 min | fluorescent lamp | 2.76 | 3.46 | 22.07 |
| Example 5 | 100 | N | ammonia water (air-saturated) | 10 min | shielded | 0.64 | 0.81 | 9.13 |
| Example 6 | 100 | N | ammonia water (hydrogen water used, nitrogen atmosphere) | 10 min | shielded | 0.16 | 0.22 | 3.69 |
| Example 7 | 100 | P | ammonia water | 10 min | shielded | 0.56 | 1.01 | 12.59 |
| Comparative Example 7 | 100 | P | ammonia water | 10 min | fluorescent lamp | 3.31 | 4.02 | 25.96 |
| Example 8 | 100 | N+ | ammonia water | 10 min | shielded | 2.10 | 2.57 | 18.82 |
| Comparative Example 8 | 100 | N+ | ammonia water | 10 min | fluorescent lamp | 9.36 | 11.51 | 70.24 |
| initial value | 110 | N | no | no | no | 0.10 | 0.13 | 1.22 |
| Example 9 | 110 | N | ammonia water | 10 min | shielded | 0.34 | 0.42 | 5.45 |
| Comparative Example 9 | 110 | N | ammonia water | 10 min | fluorescent lamp | 1.89 | 2.52 | 20.00 |
| initial value | 551 | N | no | no | no | 0.13 | 0.16 | 1.52 |
| Example 10 | 551 | N | ammonia water | 10 min | shielded | 0.18 | 0.28 | 7.36 |
| Comparative Example 10 | 551 | N | ammonia water | 10 min | fluorescent lamp | 0.22 | 0.52 | 12.89 |
| Example 11 | 551 | N | ammonia water (air-saturated) | 10 min | shielded | 0.15 | 0.22 | 4.54 |
| Example 12 | 551 | N | ammonia water (hydrogen water used, nitrogen atmosphere) | 10 min | shielded | 0.09 | 0.11 | 1.42 |
| Comparative Example 11 | 551 | N | ammonia water (hydrogen water used, nitrogen atmosphere) | 10 min | fluorescent lamp | 0.17 | 0.41 | 10.32 |
| initial value | 551 | P | no | no | no | 0.11 | 0.14 | 1.25 |
| Example 13 | 551 | P | ammonia water | 10 min | shielded | 0.11 | 0.17 | 4.81 |
| Comparative Example 12 | 551 | P | ammonia water | 10 min | fluorescent lamp | 0.30 | 0.53 | 7.27 |
| initial value | 111 | P | no | no | no | 0.09 | 0.12 | 1.01 |
| Example 14 | 111 | P | ammonia water | 10 min | shielded | 0.50 | 0.62 | 4.78 |
| Comparative Example 13 | 111 | P | ammonia water | 10 min | fluorescent lamp | 0.83 | 1.03 | 7.65 |

As is apparent from Table 2, in the case of the light shielding state, even when the silicon surface is of any plane orientation or type, the surface microroughness can be reduced. The influence of light from the fluorescent lamp is equal to that of LED light having a single wavelength of 530 nm or 625 nm.

Figure 7:
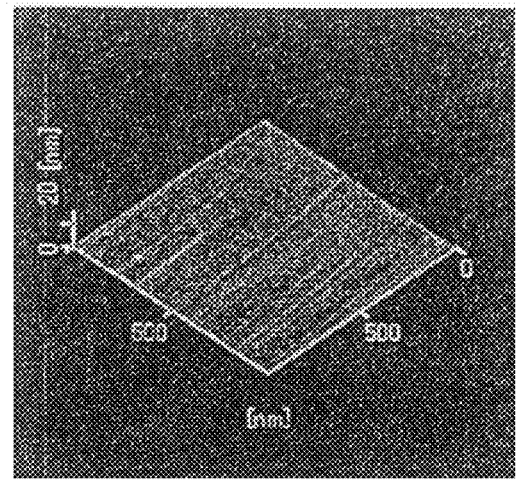
FIG. 7 is a view showing AFM images in Example 18 of the present invention and Comparative Example 18.
Figure 7:
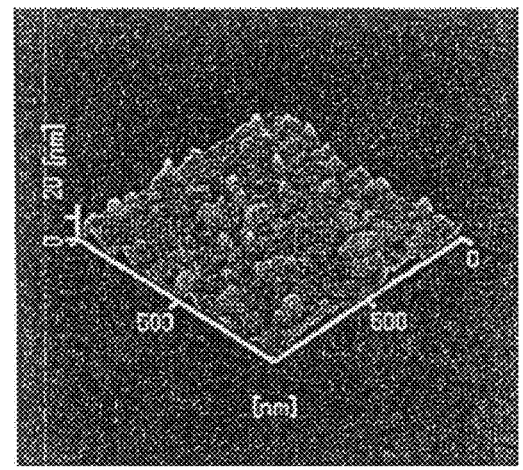

It is apparent that the surface microroughness can be significantly reduced by light shielding in the case of the plane orientation of, particularly, a 551 plane. FIG. 7 shows AFM images in Example 18 and Comparative Example 18.

In the examples and comparative examples, in order to make a difference between the irradiation using the fluorescent lamp and the light shielding clear, the surface treatment is performed for a long time. Actual treatment is performed for a short time of approximately 10 seconds to 15 minutes. In this case, the deterioration of the surface microroughness can be further avoided.

Before the experiments of Table 3, the silicon wafer is cleaned in advance with sulfuric acid/hydrogen peroxide water. After that, the resultant silicon wafer is rinsed with ultra-pure water for 5 minutes to be used.

Examples are performed in a light shielding environment. Various chemical solutions are used as surface treatment liquids. Surface treatment times are set to times as shown in the table. The surface treatment is performed by the same method as in Example 4.

The silicon wafer is subjected to surface treatment with chemical solutions and then rinsed in the light shielding state with ultra-pure water added with hydrogen (dissolving oxygen concentration is equal to or lower than 1 ppb and hydrogen concentration is 1.3 ppm to 1.5 ppm) for 5 minutes. After that, the silicon wafer is pulled up and dried with nitrogen blowing. Then, the microroughness of the silicon surface is measured.

As is apparent from the table, when hydrofluoric acid treatment is particularly performed in the light shielding state, the surface microroughness is reduced and excellent values are obtained in a (110) plane and a (551) plane.

TABLE 2

| | type of substrate | | surface treatment condition | | | surface microroughness (nm) | | |
|---|---|---|---|---|---|---|---|---|
| | plane orientation | type | bath | time | light | Ra | Rms | P − V |
| Example 15 | 100 | N | hydrogen-added ultra pure water | 3 h | shielded | 0.18 | 0.23 | 1.87 |
| Comparative Example 14 | 100 | N | hydrogen-added ultra pure water | 3 h | fluorescent lamp | 0.24 | 0.30 | 2.92 |
| Example 16 | 110 | N | hydrogen-added ultra pure water | 1 h | shielded | 0.20 | 0.25 | 2.70 |
| Comparative Example 15 | 110 | N | hydrogen-added ultra pure water | 1 h | fluorescent lamp | 0.23 | 0.29 | 3.85 |
| Example 17 | 110 | N | hydrogen-added ultra pure water | 24 h | shielded | 2.12 | 2.64 | 18.00 |
| Comparative Example 16 | 110 | N | hydrogen-added ultra pure water | 24 h | fluorescent lamp | 3.33 | 4.19 | 26.72 |
| Comparative Example 17 | 110 | N | hydrogen-added ultra pure water | 24 h | LED 530 nm | 3.77 | 4.67 | 27.57 |
| Example 18 | 551 | N | hydrogen-added ultra pure water | 24 h | shielded | 0.13 | 0.17 | 3.93 |
| Comparative Example 18 | 551 | N | hydrogen-added ultra pure water | 24 h | fluorescent lamp | 4.10 | 4.98 | 30.78 |
| Comparative Example 19 | 551 | N | hydrogen-added ultra pure water | 24 h | LED 530 nm | 4.98 | 6.06 | 33.91 |
| Comparative Example 20 | 551 | N | hydrogen-added ultra pure water | 24 h | LED 625 nm | 4.17 | 5.05 | 59.24 |

Examples 19 to 24

Investigation has been made about an effect of the present invention on surface microroughness of a silicon wafer subjected to surface treatment with a hydrofluoric acid and a buffered hydrofluoric acid. Experimental conditions and results are shown in Table 3.

TABLE 3

| | type of substrate | | surface treatment condition | | | surface microroughness (nm) | | |
|---|---|---|---|---|---|---|---|---|
| | plane orientation | type | bath | time | light | Ra | Rms | P − V |
| Example 19 | 100 | N | HF: 4%/NH$_4$F: 37% aqueous solution | 1 h | shielded | 0.45 | 0.58 | 5.67 |
| Example 20 | 110 | N | HF: 4%/NH$_4$F: 37% aqueous solution | 1 h | shielded | 0.18 | 0.24 | 3.07 |

TABLE 3-continued

| | type of substrate | | surface treatment condition | | | surface microroughness (nm) | | |
|---|---|---|---|---|---|---|---|---|
| | plane orientation | type | bath | time | light | Ra | Rms | P – V |
| Example 21 | 551 | N | HF: 4%/NH$_4$F: 37% aqueous solution | 1 h | shielded | 0.14 | 0.18 | 2.48 |
| Example 22 | 100 | N | HF: 4% aqueous solution | 1 h | shielded | 0.12 | 0.15 | 1.36 |
| Example 23 | 110 | N | HF: 4% aqueous solution | 1 h | shielded | 0.08 | 0.10 | 1.11 |
| Example 24 | 551 | N | HF: 4% aqueous solution | 1 h | shielded | 0.08 | 0.10 | 1.18 |

Examples 25 to 28 and Comparative Examples 21 to 23

Investigation has been made about an effect of the present invention on surface microroughness of a silicon wafer subjected to surface treatment with various chemical solutions shown in Table 4. Experimental conditions and results are shown in Table 4.

Before the experiments of Table 4, the silicon wafer is cleaned in advance with sulfuric acid/hydrogen peroxide water and then subjected to dilute hydrofluoric acid treatment (0.5%, room temperature, 1 minute) to remove an oxide film from the surface thereof. After that, the resultant silicon wafer is rinsed with ultra-pure water for 5 minutes to be used.

Examples 25 to 28 are performed in a light shielding environment. Comparative examples 21 to 23 are performed during irradiation using a halogen lamp. An illuminance at the vicinity of the silicon surface is set to approximately 100000 lx in the case of the irradiation using the halogen lamp. Various chemical solutions are used as surface treatment liquids. Surface treatment times are set to times as shown in the table. Specifically, APM(1/1/5) indicates a cleaning liquid which has a mixture ratio of ammonia water (29 wt %)/hydrogen peroxide water (31 wt %)/water that is set to 1/1/5. The surface treatment is performed by the same method as in Example 4.

The silicon wafer is subjected to surface treatment with chemical solutions and then rinsed in the light shielding state with ultra-pure water added with hydrogen (dissolving oxygen concentration is equal to or lower than 1 ppb and hydrogen concentration is 1.3 ppm to 1.5 ppm) for 5 minutes. After that, the silicon wafer is pulled up and dried with nitrogen blowing. Then, the microroughness of the silicon surface is measured.

As is apparent from the table, when surface treatment is performed in the light shielding state, the surface microroughness is reduced for various chemical solutions.

TABLE 4

| | type of substrate | | surface treatment condition | | | surface microroughness |
|---|---|---|---|---|---|---|
| | plane orientation | type | bath | time | Light | Ra (nm) |
| Example 25 | 100 | N | APM(1/1/5), room temperature | 1 h | Shielded | 0.13 |
| Comparative Example 21 | 100 | N | APM(1/1/5), room temperature | 1 h | Halogen | 0.14 |
| Example 26 | 110 | N | APM(1/1/5), room temperature | 1 h | Shielded | 0.16 |
| Example 27 | 100 | N | HF: 0.5%/H$_2$O$_2$: 1% aqueous solution, room temperature | 1 h | Shielded | 0.18 |
| Comparative Example 22 | 100 | N | HF: 0.5%/H$_2$O$_2$: 1% aqueous solution, room temperature | 1 h | Halogen | 0.19 |
| Example 28 | 110 | N | HF: 0.5%/H$_2$O$_2$: 1% aqueous solution, room temperature | 1 h | Shielded | 0.11 |
| Comparative Example 23 | 110 | N | HF: 0.5%/H$_2$O$_2$: 1% aqueous solution, room temperature | 1 h | Halogen | 0.16 |

INDUSTRIAL APPLICABILITY

The present invention can be applied to not only surface treatment for a silicon wafer but also surface treatment using a liquid for other compound semiconductors.

The invention claimed is:
1. A semiconductor device manufacturing method of manufacturing a semiconductor device which has a semiconductor substrate and a gate insulating film formed on a surface of the semiconductor substrate, comprising:
preparing the semiconductor substrate of silicon which has a band gap energy of 1.1 eV; and performing a wet process on a processed surface of the semiconductor substrate in a shielded atmosphere which shields light having energy greater than the band gap energy to protect the processed surface from being roughened by the light and to render the processed surface into a micro-roughness reduced surface, wherein the wet process is performed by using water which has a dissolved concentration of oxygen not greater than 8 ppm; and forming the gate insulating film on the micro-roughness reduced surface, after the wet process is performed, wherein the micro-roughness of the micro-roughness reduced surface is maintained from the performing the wet process until the forming the gate insulating film.

2. A semiconductor device manufacturing method as claimed in claim 1, wherein the silicon used as the semiconductor substrate has at least one plane orientation of a (100) plane, a plane offcut by 4° from the (100) plane, and a (551) plane.

3. A semiconductor device manufacturing method as claimed in claim 1, wherein the light shielded has a wavelength not longer than 1.1 μm.

* * * * *